United States Patent
Kim et al.

(10) Patent No.: US 6,693,009 B1
(45) Date of Patent: Feb. 17, 2004

(54) FLASH MEMORY CELL WITH MINIMIZED FLOATING GATE TO DRAIN/SOURCE OVERLAP FOR MINIMIZING CHARGE LEAKAGE

(75) Inventors: Hyeon-Seag Kim, San Jose, CA (US);
Unsoon Kim, Santa Clara, CA (US);
Munseork Choi, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 156 days.

(21) Appl. No.: 09/713,390

(22) Filed: Nov. 15, 2000

(51) Int. Cl.[7] .................. H01L 21/336; H01L 21/3205; H01L 21/302
(52) U.S. Cl. ................. 438/257; 438/301; 438/302; 438/593; 438/739
(58) Field of Search .................. 438/201, 257, 438/258, 264, 301, 303, 305, 306, 593, 594, 739, 299, 302

(56) References Cited

U.S. PATENT DOCUMENTS

| | | | | |
|---|---|---|---|---|
| 4,720,323 A | * | 1/1988 | Sato ........................... | 438/261 |
| 5,286,665 A | * | 2/1994 | Muragishi et al. .......... | 438/257 |
| 5,847,427 A | * | 12/1998 | Hagiwara .................... | 257/324 |
| 6,136,653 A | * | 10/2000 | Sung et al. .................. | 438/266 |

OTHER PUBLICATIONS

T. Ghani et al., *100 nm Gate Length High Performance/Low Power CMOS Transistor Structure*, IEDM, 1999, pp. 1–4.
J. Chen et al., *Subbreakdown Drain Leakage Current in MOSFET*, IEEE EDL–8, #11, Nov. 1987, pp. 515–517.
S. Haddad et al., *Degradation Due to Hole Trapping in Flash Memory Cell*, IEEE EDL–10, #3, Mar. 1989, pp. 117–119.

* cited by examiner

Primary Examiner—Amir Zarabian
Assistant Examiner—Toniae M. Thomas
(74) Attorney, Agent, or Firm—Monica H. Choi

(57) ABSTRACT

For fabricating a flash memory cell of an electrically programmable memory device on a semiconductor substrate, any region of a stack of a layer of tunnel dielectric material, a layer of floating gate material, a layer of floating dielectric material, and a layer of control gate material, not under a patterning structure, is etched away to form a tunnel dielectric structure comprised of the tunnel dielectric material disposed under the patterning structure, to form a floating gate structure comprised of the floating gate material over the tunnel dielectric structure, to form a floating dielectric structure comprised of the floating dielectric material disposed over the floating gate structure, and to form a control gate structure comprised of the control gate material disposed over the floating dielectric structure. The length of the floating gate structure is trimmed down from a first length of the patterning structure to a second length by etching away a portion of the floating gate material from at least one of a first sidewall and a second sidewall of the floating gate structure. A drain bit line junction of the flash memory cell is formed toward the first sidewall of the floating gate structure, and a source bit line junction of the flash memory cell is formed toward the second sidewall of the floating gate structure. The trim of the length of the floating gate structure minimizes the overlap of the floating gate structure over at least one of the drain bit line junction of the flash memory cell and the source bit line junction of the flash memory cell to minimize leakage of charge from the floating gate structure during programming or erasing of the flash memory cell.

20 Claims, 5 Drawing Sheets

FLASH MEMORY CELL WITH MINIMIZED FLOATING GATE TO DRAIN/SOURCE OVERLAP FOR MINIMIZING CHARGE LEAKAGE

TECHNICAL FIELD

The present invention relates generally to flash memory cells in electrically programmable memory devices, and more particularly, to a flash memory cell with minimized overlap between the floating gate and the drain and/or source bit line junction for minimizing charge leakage from the floating gate to the drain and/or source bit line junction during programming or erasing of the flash memory cell.

BACKGROUND OF THE INVENTION

Referring to FIG. 1, a flash memory cell 100 of a prior art flash memory device includes a tunnel dielectric structure 102 typically comprised of silicon dioxide ($SiO_2$) or nitrided oxide as known to one of ordinary skill in the art of integrated circuit fabrication. The tunnel dielectric structure 102 is disposed on a semiconductor substrate 103. In addition, a floating gate structure 104, comprised of a conductive material such as polysilicon for example, is disposed over the tunnel dielectric structure 102. A floating dielectric structure 106, typically comprised of silicon dioxide ($SiO_2$), is disposed over the floating gate structure 104. A control gate structure 108, comprised of a conductive material, is disposed over the floating dielectric structure 106.

A drain bit line junction 110 that is doped with a junction dopant, such as arsenic (As) or phosphorous (P) for example, is formed within an active device area 112 of the semiconductor substrate 103 toward a left sidewall of the floating gate structure 104 in FIG. 1. A source bit line junction 114 that is doped with the junction dopant is formed within the active device area 112 of the semiconductor substrate 106 toward a right sidewall of the floating gate structure 104 of FIG. 1. The active device area 112 of the semiconductor substrate 103 is defined by shallow trench isolation structures 116 that electrically isolate the flash memory device 100 from other integrated circuit devices within the semiconductor substrate 103.

During the program or erase operations of the flash memory cell 100 of FIG. 1, charge carriers are injected into or injected out of the floating gate structure 104. Such variation of the amount of charge carriers within the floating gate structure 104 alters the threshold voltage of the flash memory cell 100, as known to one of ordinary skill in the art of electronics.

For example, when electrons are the charge carriers that are injected into the floating gate structure 104, the threshold voltage increases. Alternatively, when electrons are the charge carriers that are injected out of the floating gate structure 104, the threshold voltage decreases. These two conditions are used as the two states for storing digital information within the flash memory cell 100, as known to one of ordinary skill in the art of electronics.

During programming of the flash memory cell 100 for example, a voltage of+9 Volts is applied on the control gate structure 108, a voltage of+5 Volts is applied on the drain bit line junction 110, and a voltage of 0 Volts (or a small bias of 0.25 Volts for example) is applied on the source bit line junction 114 and on the semiconductor substrate 103. Alternatively, during erasing of the flash memory cell 100, referring to FIG. 2, a voltage of−9.5 Volts is applied on the control gate structure 108, a voltage of 0 Volts is applied on the drain bit line junction 110, and a voltage of+4.5 Volts is applied on the source bit line junction 114 and on the semiconductor substrate 103.

In any case of FIGS. 1 or 2, charge carriers are injected through the tunnel dielectric structure 102 and into the floating gate structure 104. Such charge carriers may be from the channel region between the drain bit line junction 110 and the source bit line junction 114 in the semiconductor substrate 103. Such voltage biases result in a large voltage difference of about 9V between the control gate structure 108 and the source bit line junction 114 during programming of the flash memory cell 100 and of about 14V between the control gate structure 108 and the source bit line junction 114 during erasing of the flash memory cell 100. These relatively large voltage differences between the control gate structure 108 and the source bit line junction 114 may cause charge carriers to undesirably leak out of the floating gate structure 104 and to the source bit line junction 114 resulting in gate induced source leakage current since the floating gate structure 104 overlaps the source bit line junction 114.

Furthermore, a voltage difference of about+5 Volts between the drain bit line junction 110 and the source bit line junction 114 may cause charge carriers from the gate induced source leakage current to migrate to the drain bit line junction 110 resulting in undesired bit line leakage current, especially when the drain bit line junction 110 and the source bit line junction 114 are situated relatively close together in a flash memory device having scaled down dimensions. The gate induced source leakage current and the bit line leakage current degrade the performance of the flash memory cell 100.

Thus, a mechanism is desired for minimizing the gate induced source leakage current to enhance the performance of the flash memory cell.

SUMMARY OF THE INVENTION

Accordingly, in a general aspect of the present invention, the overlap of the floating gate structure over the drain bit line junction and/or the source bit line junction is minimized to in turn minimize the gate induced source leakage current.

In one embodiment of the present invention, for fabricating a flash memory cell of an electrically programmable memory device on a semiconductor substrate, a layer of tunnel dielectric material is deposited on the semiconductor substrate, a layer of floating gate material is deposited on the layer of tunnel dielectric material, a layer of floating dielectric material is deposited on the layer of floating gate material, and a layer of control gate material is deposited on the floating dielectric material. A layer of patterning material is deposited and patterned on the layer of control gate material to form a patterning structure having a first length on the layer of control gate material. Any region of the layer of tunnel dielectric material, the layer of floating gate material, the layer of floating dielectric material, and the layer of control gate material not under the patterning structure is etched away to form a tunnel dielectric structure comprised of the tunnel dielectric material disposed under the patterning structure, to form a floating gate structure comprised of the floating gate material disposed under the patterning structure, to form a floating dielectric structure comprised of the floating dielectric material disposed under the patterning structure, and to form a control gate structure comprised of the control gate material disposed under the patterning structure.

In a general aspect of the present invention, the length of the floating gate structure is trimmed down from the first length of the patterning structure to a second length at an interface between the floating gate structure and the tunnel dielectric structure by etching away a portion of the floating gate material from at least one of a first sidewall and a second sidewall of the floating gate structure. A drain bit line junction of the flash memory cell is formed toward the first sidewall of the floating gate structure, and a source bit line junction of the flash memory cell is formed toward the second sidewall of the floating gate structure, by implanting a drain and source dopant into exposed regions of the semiconductor substrate. A thermal anneal is then performed such that the floating gate structure overlaps the drain bit line junction of the flash memory cell by being disposed over a portion of the drain bit line junction of the flash memory cell and such that the floating gate structure overlaps the source bit line junction of the flash memory cell by being disposed over a portion of the source bit line junction of the flash memory cell. The trim of the length of the floating gate structure minimizes the overlap of the floating gate structure over at least one of the drain bit line junction of the flash memory cell and the source bit line junction of the flash memory cell.

In this manner, because the overlap of the floating gate structure over the source bit line junction and/or the drain bit line junction is minimized, charge carrier leakage from the floating gate structure to the source bit line junction and/or the drain bit line junction is minimized during programming or erasing of the floating gate structure.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, and 14 refer to elements having similar structure and function.

DETAILED DESCRIPTION

Figure 3:
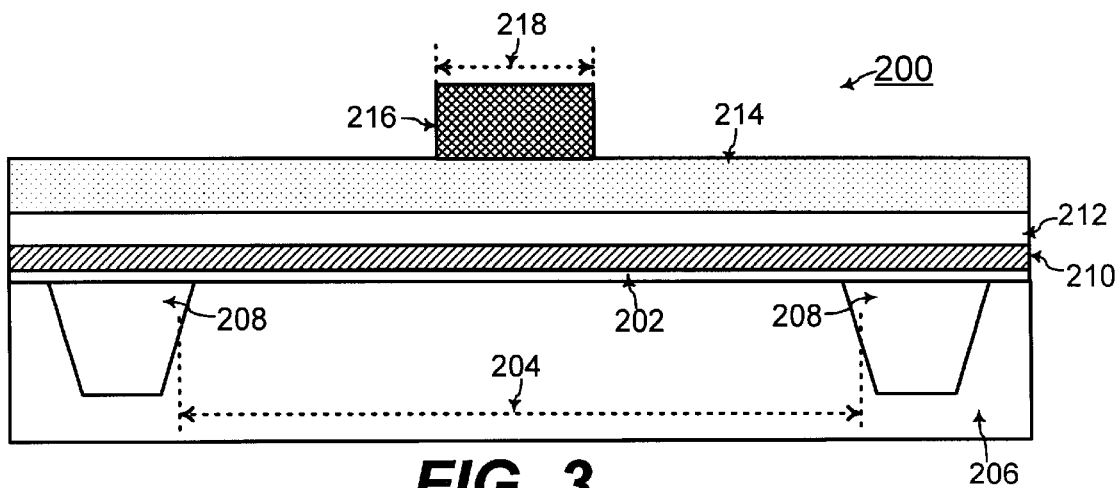
FIGS. 3–7 show cross-sectional views for illustrating the steps for trimming the length of the floating gate structure at both sidewalls of the floating gate-structure to minimize gate induced source leakage current with a substantially rectangular shape of the floating gate structure, according to one embodiment of the present invention.

Referring to FIG. 3, for fabricating a flash memory device 200 according to an aspect of the present invention, a layer of tunnel dielectric material 202 is deposited on an active device area 204 of the semiconductor substrate 206. The semiconductor substrate 206 is comprised of silicon in one embodiment of the present invention. The active device area 204 of the semiconductor substrate 206 is defined by shallow trench isolation structures 208 that electrically isolate the flash memory device 200 from other integrated circuit devices within the semiconductor substrate 206. The layer of tunnel dielectric material 202 is comprised of silicon dioxide ($SiO_2$) with nitrogen oxide ($N_2O$) according to one embodiment of the present invention. Processes for deposition of such material for the layer of tunnel dielectric material 202 are known to one of ordinary skill in the art of integrated circuit fabrication.

In addition, a layer of floating gate material 210 is deposited on the layer of tunnel dielectric material 202. The layer of floating gate material 210 is comprised of doped polysilicon in one embodiment of the present invention. Processes, such as in-situ dopant deposition of polysilicon, for deposition of the layer of floating gate material 210 are known to one of ordinary skill in the art of integrated circuit fabrication.

A layer of floating dielectric material 212 is then deposited on the layer of floating gate material 210. The layer of floating dielectric material 212 is comprised of silicon dioxide ($SiO_2$) in one embodiment of the present invention, and processes for deposition of such material for the layer of floating dielectric material 212 are known to one of ordinary skill in the art of integrated circuit fabrication.

Finally, a layer of control gate material 214 is deposited on the layer of floating dielectric material 212. The layer of control gate material 214 is comprised of undoped polysilicon according to one embodiment of the present invention, and processes for deposition of such material for the layer of control gate material 214 are known to one of ordinary skill in the art of integrated circuit fabrication.

A layer of patterning material such as photoresist material is then deposited on the layer of control gate material 214 and is patterned to form a patterning structure 216 having a first length 218. Processes for depositing and patterning photoresist material to form the patterning structure 216 are known to one of ordinary skill in the art of integrated circuit fabrication.

Figure 4:
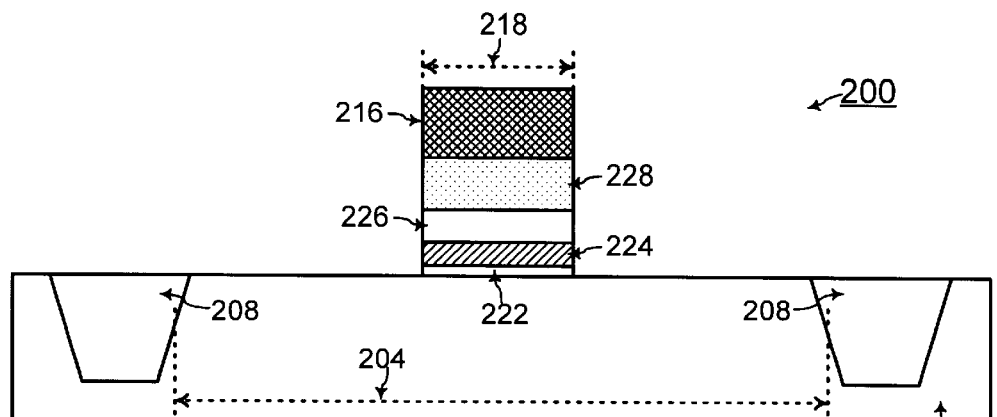

Referring to FIG. 4, any region of the layer of tunnel dielectric material 202, the layer of floating gate material 210, the layer of floating dielectric material 212, and the layer of control gate material 214 not under the patterning structure 216 is etched away. A tunnel dielectric structure 222 is formed and is comprised of the tunnel dielectric material remaining under the patterning structure 216. A floating gate structure 224 is formed and is comprised of the floating gate material remaining under the patterning structure 216. A floating dielectric structure 226 is formed and is comprised of the floating dielectric material remaining under the patterning structure 216. A control gate structure 228 is formed and is comprised of the control gate material remaining under the patterning structure 216. Processes for etching away portions of the layer of tunnel dielectric material 202, the layer of floating gate material 210, the layer of floating dielectric material 212, and the layer of control gate material 214 not under the patterning structure 216 are known to one of ordinary skill in the art of integrated circuit fabrication.

Figure 5:
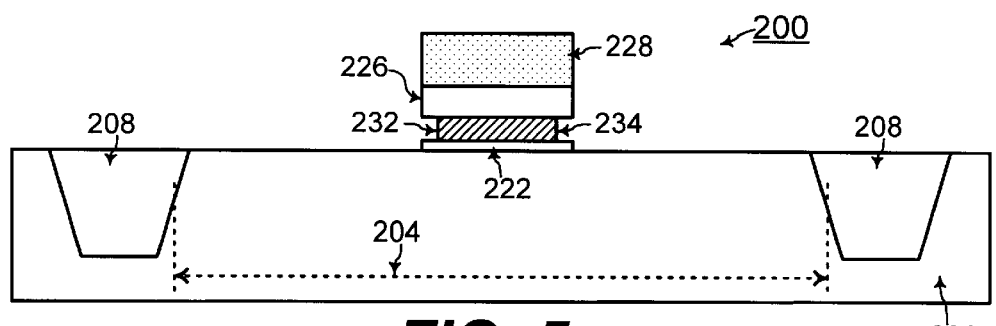

In FIG. 4, the tunnel dielectric structure 222, the floating gate structure 224, the floating dielectric structure 226, and the control gate structure 228 have the same first length 218 of the patterning structure 216. Referring to FIGS. 4 and 5, a portion of the floating gate structure 224 at a first sidewall 232 of the floating gate structure 224 and a second sidewall 234 of the floating gate structure are etched away to trim the length of the floating gate structure 224 from the first length 218 to a second length that is smaller than the first length. Referring to FIG. 5, the first sidewall 232 and the second sidewall 234 are trimmed inward from the first length 218 of the patterning structure 216. Such selective etching of the floating gate structure 224 may be achieved because the floating gate structure 224 which is comprised of doped polysilicon has a faster etching rate in some etching agents, such as phosphoric acid ($H_3PO_4$), than the control gate structure 228 which is comprised of undoped polysilicon. Selective etching processes in general are known to one of ordinary skill in the art of integrated circuit fabrication.

Figure 6:
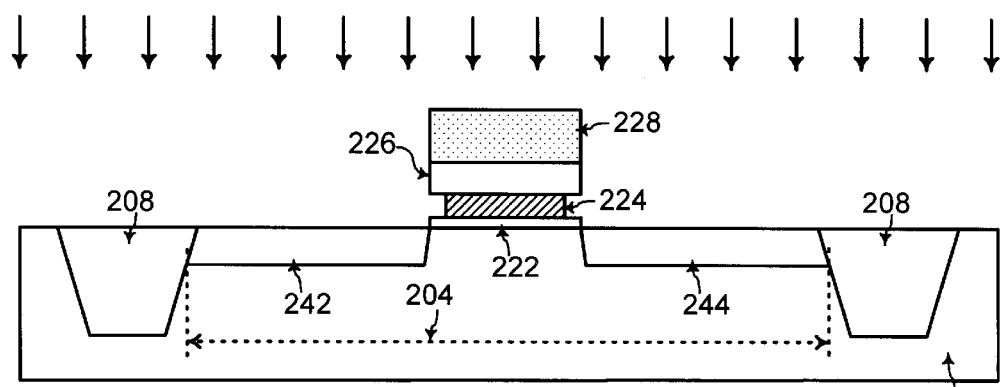

Referring to FIG. 6, a drain and source dopant is implanted into exposed regions of the active device area 204 of the semiconductor substrate 206 to form a drain bit line junction 242 toward the first sidewall 232 of the floating gate structure 224 and to form a source bit line junction 244 toward the second sidewall 234 of the floating gate structure 224. The source and drain dopant may be comprised of arsenic for example, and processes for implanting such dopant into the semiconductor substrate 206 are known to one of ordinary skill in the art of integrated circuit fabrication.

Figure 7:
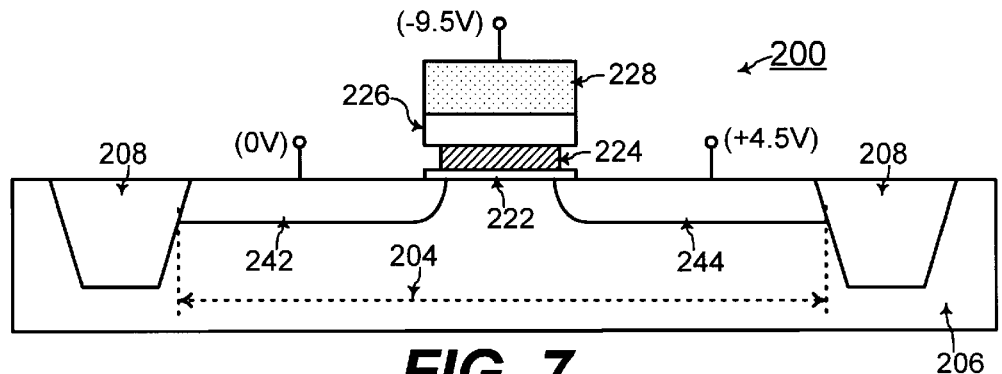

Referring to FIG. 7, a thermal anneal is then performed to activate the drain and source dopant in the drain bit line junction 242 and the source bit line junction 244. During the thermal anneal, thermal diffusion of the drain and source dopant of the drain bit line junction 242 and the source bit line junction 244 causes a portion of the drain bit line junction 242 and the source bit line junction 244 to be disposed under the floating gate structure 224. Thus, the floating gate structure 224 overlaps a portion of the drain bit line junction 242 and the source bit line junction 244 for proper operation of the flash memory cell 200.

Figure 1:
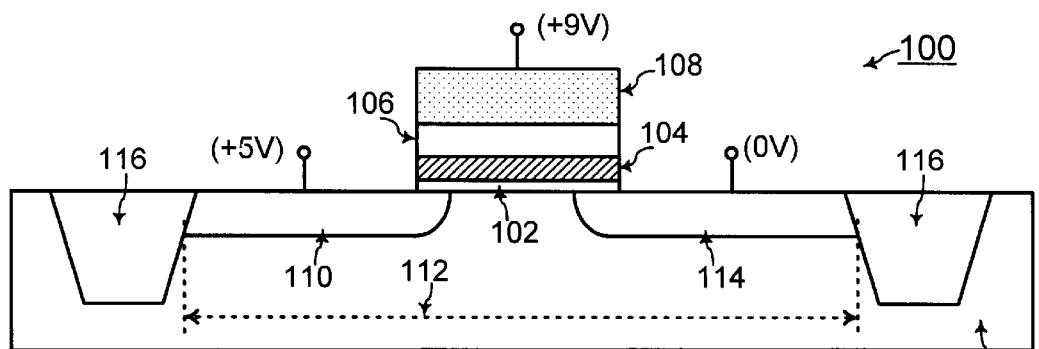
FIG. 1 shows a cross-sectional view of a flash memory cell without minimized gate induced source leakage current during programming of the flash memory cell, according to the prior art.
Figure 2:
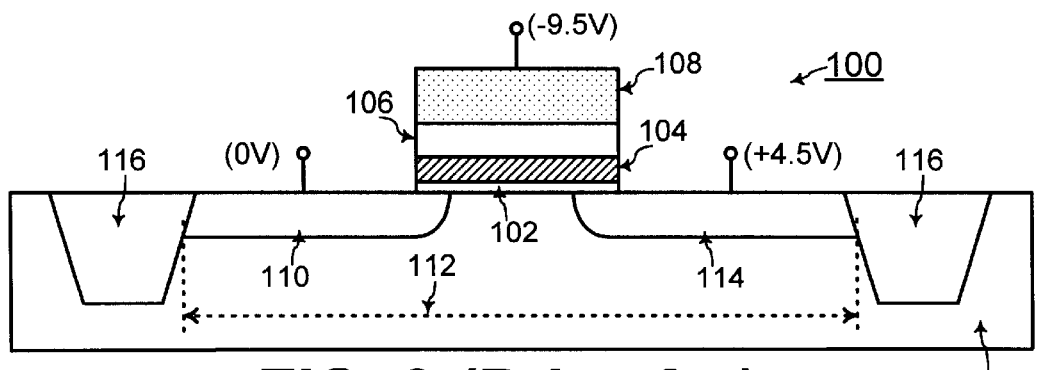
FIG. 2 shows alternative voltage biases on the flash memory cell of FIG. 1 during erasing of the flash memory cell, according to the prior art.

However, referring to FIG. 7, because the length of the floating gate structure 224 is trimmed at the first sidewall and the second sidewall of the floating gate structure 224, the overlap of the floating gate structure 224 over the drain bit line junction 242 and the source bit line junction 244 is minimized. With such minimized overlap, during erasing of the flash memory cell when a voltage difference of 14V is applied between the control gate structure 228 and the source bit line junction 244 (or during programming of the flash memory cell when a voltage difference of 9V is applied between the control gate structure 228 and the source bit line junction 244 as illustrated in FIG. 1), charge carrier leakage from the floating gate structure 224 to the source bit line junction 244 is in turn minimized. Such minimized charge carrier leakage from the floating gate structure 224 to the source bit line junction 244 enhances the duration of charge carrier storage within the floating gate structure 224 of the flash memory device 200. Such minimized charge carrier leakage from the floating gate structure 224 to the source bit line junction 244 in turn also minimizes bit line charge carrier leakage between the drain bit line junction 242 and the source bit line junction 244.

Figure 8:
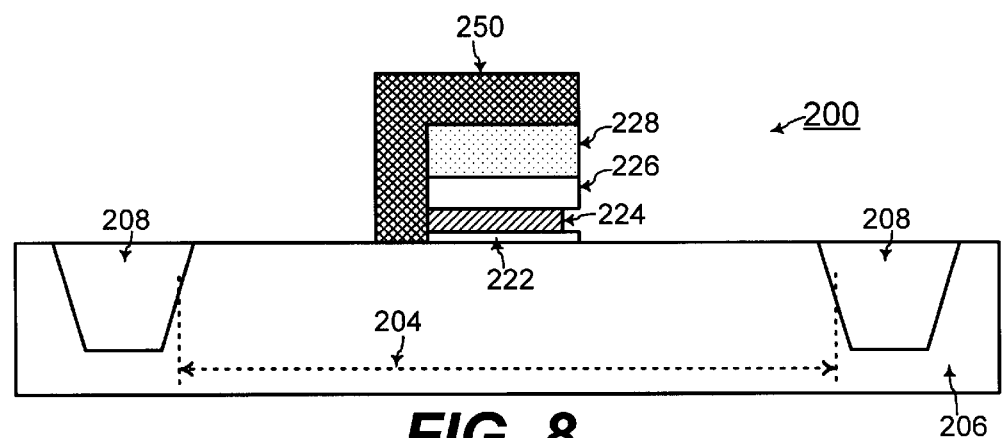
FIGS. 8 and 9 show cross-sectional views for illustrating the steps for trimming the length of the floating gate structure at only one sidewall of the floating gate structure to minimize gate induced source leakage current with a substantially rectangular shape of the floating gate structure, according to another embodiment of the present invention.
Figure 9:
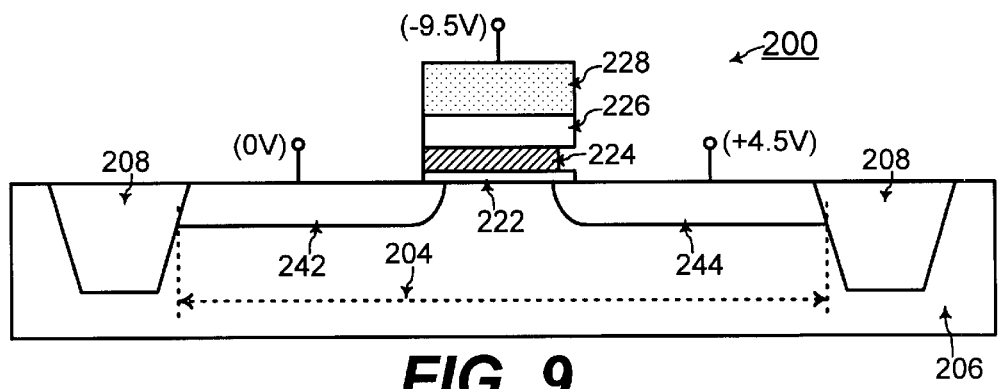

Referring to FIGS. 4 and 8, in another embodiment of the present invention, a photoresist material 250 is deposited to cover the first sidewall of the floating gate structure 224 before the length of the floating gate structure 224 is trimmed down. Thus, only the second sidewall of the floating gate structure 224 is trimmed down. Referring to FIGS. 8 and 9, in this case, after removal of the photoresist material 250, the overlap of the floating gate structure 224 over only the source bit line junction 244 is minimized. This embodiment of the present invention may be advantageously used when the voltage difference between the control gate structure 228 and the drain bit line junction 242 is relatively low (such as less than about 5 Volts for example) since the charge carrier leakage current from the floating gate structure 224 to the drain bit line junction 242 is negligible in that case.

Nevertheless, referring to FIG. 9, because the length of the floating gate structure 224 is trimmed at the second sidewall of the floating gate structure 224, the overlap of the floating gate structure 224 over the source bit line junction 244 is minimized. With such minimized overlap, during erasing of the flash memory cell when a voltage difference of 14V is applied between the control gate structure 228 and the source bit line junction 244 (or during programming of the flash memory cell when a voltage difference of 9V is applied between the control gate structure 228 and the source bit line junction 244 as illustrated in FIG. 1), charge carrier leakage from the floating gate structure 224 to the source bit line junction 244 is in turn minimized. Such minimized charge carrier leakage from the floating gate structure 224 to the source bit line junction 244 enhances the duration of charge carrier storage within the floating gate structure 224 of the flash memory device 200. Such minimized charge carrier leakage from the floating gate structure 224 to the source bit line junction 244 in turn also minimizes bit line charge carrier leakage between the drain bit line junction 242 and the source bit line junction 244.

Figure 10:
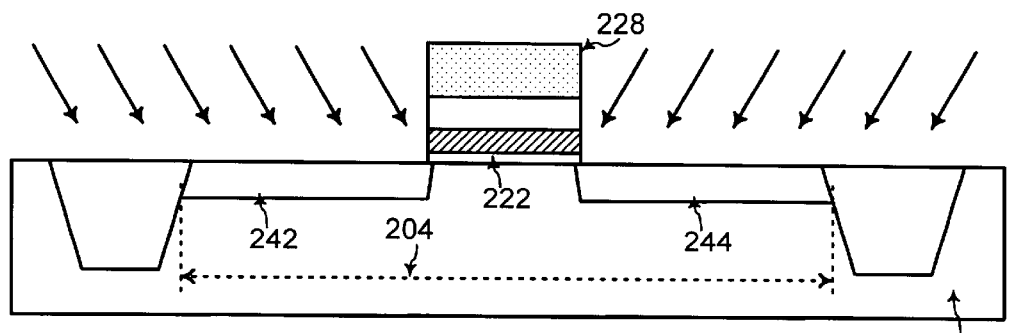
FIGS. 10, 11, and 12 show cross-sectional views for illustrating the steps for trimming the length of the floating gate structure at both sidewalls of the floating gate structure to minimize gate induced source leakage current with a tapered shape of the floating gate structure, according to another embodiment of the present invention.

In the embodiments of FIGS. 7 and 9, the floating gate structure 224 retains a substantially rectangular shape after the first sidewall and the second sidewall of the floating gate structure 224 are etched away to trim down the length of the floating gate structure 224. Referring to FIG. 10, in another embodiment of the present invention, the drain and source dopant is implanted at an angle directed toward the first sidewall and the second sidewall of the floating gate structure 224 to form the drain bit line junction 242 and the source bit line junction 244. Processes for angled implantation of dopant into the semiconductor substrate 206 are known to one of ordinary skill in the art of integrated circuit fabrication.

Figure 11:
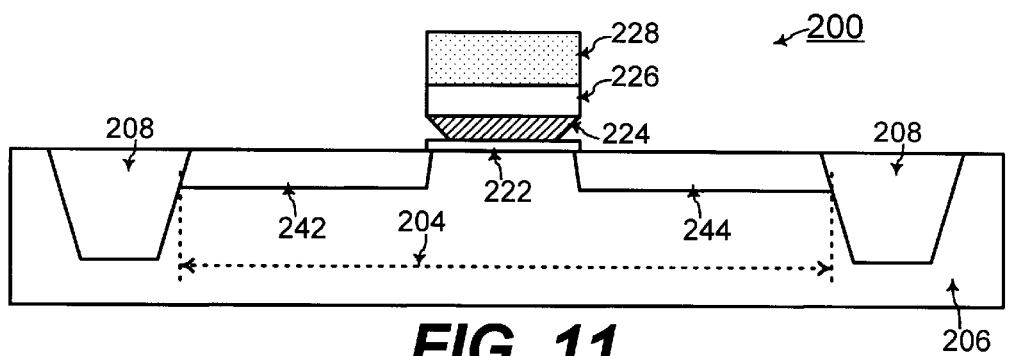

With such angled implantation of the drain and source dopant, the drain and source dopant is implanted at an angle into the first sidewall and the second sidewall of the floating gate structure 224. Because of the shadowing effect, only the bottom triangular portion of the floating gate structure 224 at the first sidewall and the second sidewall of the floating gate structure 224 has the drain and source dopant implanted therein. Referring to FIG. 11, that portion of the floating gate structure 224 having the drain and source dopant implanted therein is selectively etched away. The portion of the floating gate structure 224 having the drain and source dopant implanted therein has a faster etching rate in an etching agent, such as phosphoric acid ($H_3PO_4$), for example. Selective etching processes in general are known to one of ordinary skill in the art of integrated circuit fabrication.

Thus, the floating gate structure 224 has a tapered shape with a larger length toward the top of the floating gate structure 224 near the floating gate dielectric 226 and with a shorter length toward the bottom of the floating gate structure 224 near the tunnel dielectric structure 222. In this matter, the length of the floating gate structure 224 is trimmed down toward the bottom of the floating gate structure 224 near the tunnel dielectric structure 222 at both the first sidewall and the second sidewall of the floating gate structure 224.

Figure 12:
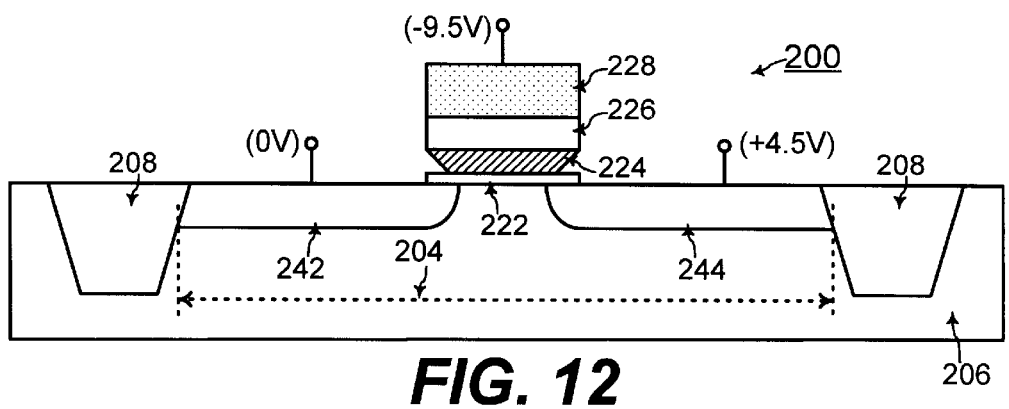

Referring to FIG. 12, because the length of the floating gate structure 224 is trimmed at the first sidewall and the second sidewall of the floating gate structure 224 with the tapered shape of the floating gate structure 224, the overlap of the floating gate structure 224 over the drain bit line junction 242 and the source bit line junction 244 is minimized. With such minimized overlap, during erasing of the flash memory cell when a voltage difference of 14V is applied between the control gate structure 228 and the source bit line junction 244 (or during programming of the flash memory cell when a voltage difference of 9V is applied between the control gate structure 228 and the source bit line junction 244 as illustrated in FIG. 1), charge carrier leakage from the floating gate structure 224 to the source bit line junction 244 is in turn minimized. Such minimized charge carrier leakage from the floating gate structure 224 to the source bit line junction 244 enhances the duration of charge carrier storage within the floating gate structure 224 of the flash memory device 200. Such minimized charge carrier leakage from the floating gate structure 224 to the source bit line junction 244 in turn also minimizes bit line charge carrier leakage between the drain bit line junction 242 and the source bit line junction 244.

Figure 13:
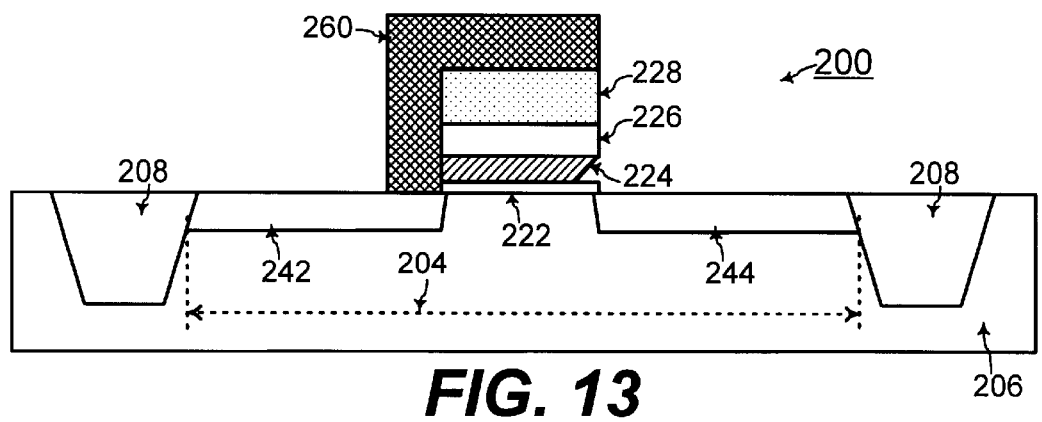
FIGS. 13 and 14 show cross-sectional views for illustrating the steps for trimming the length of the floating gate structure at only one sidewall of the floating gate structure to minimize gate induced source leakage current with a tapered shape of the floating gate structure, according to another embodiment of the present invention.

Referring to FIGS. 10 and 13, in another embodiment of the present invention, a photoresist material 260 is deposited to cover the first sidewall of the floating gate structure 224 before the length of the floating gate structure 224 is trimmed down after the angled implantation of the drain and source dopant in FIG. 10. Thus, only the second sidewall of the floating gate structure 224 is trimmed down to have the tapered sidewall with the length of the floating gate structure 224 decreasing from the top of the floating gate structure 224 to the bottom of the floating gate structure 224 toward the tunnel dielectric structure 222.

Figure 14:
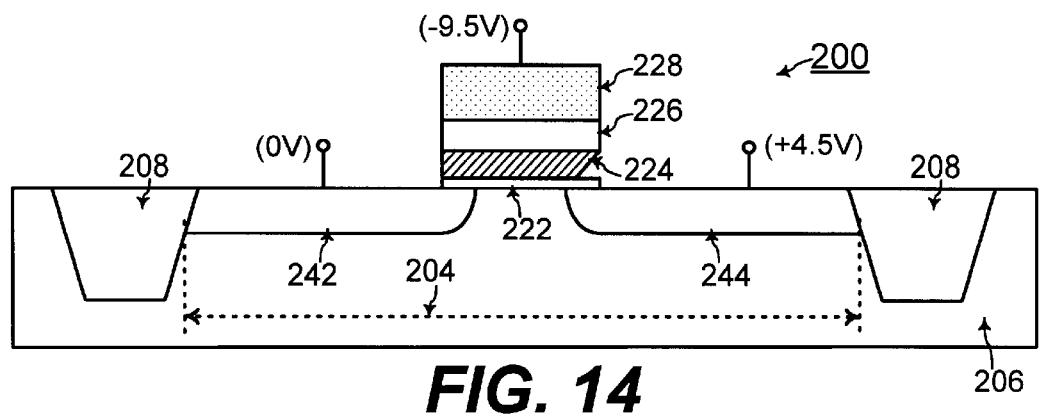

Referring to FIG. 14, after removal of the photoresist material 260, the overlap of the floating gate structure 224 over only the source bit line junction 244 is minimized. This embodiment of the present invention may be advantageously used when the voltage difference between the control gate structure 228 and the drain bit line junction 242 is relatively low (such as less than about 5 Volts for example) since the leakage current from the floating gate structure 224 to the drain bit line junction 242 is negligible in that case.

Nevertheless, referring to FIG. 14, because the length of the floating gate structure 224 is trimmed at the second sidewall of the floating gate structure 224 with the tapered shape of the second sidewall of the floating gate structure 224, the overlap of the floating gate structure 224 over the source bit line junction 244 is minimized. With such minimized overlap, during erasing of the flash memory cell when a voltage difference of 14V is applied between the control gate structure 228 and the source bit line junction 244 (or during programming of the flash memory cell when a voltage difference of 9V is applied between the control gate structure 228 and the source bit line junction 244 as illustrated in FIG. 1), charge carrier leakage from the floating gate structure 224 to the source bit line junction 244 is in turn minimized. Such minimized charge carrier leakage from the floating gate structure 224 to the source bit line junction 244 enhances the duration of charge carrier storage within the floating gate structure 224 of the flash memory device 200. Such minimized charge carrier leakage from the floating gate structure 224 to the source bit line junction 244 in turn also minimizes bit line charge carrier leakage between the drain bit line junction 242 and the source bit line junction 244.

The present invention may be used to particular advantage when the tunnel dielectric structure 222 is comprised of silicon dioxide ($SiO_2$) with nitrogen oxide ($N_{2O}$) according to one embodiment of the present invention. In that case, the sidewalls of the tunnel dielectric structure 222 have a sharper edge (than when the tunnel dielectric structure 222 is comprised of only silicon dioxide) as known to one of ordinary skill in the art of integrated circuit fabrication. With such a sharper edge at the sidewalls of the tunnel dielectric structure 222, the electric field between the floating gate structure 224 and the drain or source bit line junctions 242 and 244 is greater with potentially higher charge carrier leakage from the floating gate structure 224 to the drain or source bit line junctions 242 and 244. The minimized overlap of the floating gate structure 224 over the drain or source bit line junctions 242 and 244 minimizes such charge carrier leakage from the floating gate structure 224 to the drain or source bit line junctions 242 and 244.

The foregoing is by way of example only and is not intended to be limiting. For example, FIGS. 8, 9, 13, and 14 show trimming of the floating gate structure 224 only at the second sidewall of the floating gate structure to minimize overlap of the floating gate structure 224 only over the source bit line junction 244 to minimize charge carrier leakage from the floating gate structure to the source bit line junction 244. However, the present invention may also be practiced with trimming of the floating gate structure 224 only at the first sidewall of the floating gate structure to minimize overlap of the floating gate structure 224 only over the drain bit line junction 242 to minimize charge carrier leakage from the floating gate structure 224 to the drain bit line junction 242. Furthermore, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "bottom," "side wall," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method for fabricating a flash memory cell, including the steps of:
   A. forming, on a semiconductor substrate, a stack of a tunnel dielectric structure, a floating gate structure, a floating dielectric structure, and a control gate, each having a first length;
   B. trimming a length of at least a portion of said floating gate structure to a second length that is less than said first length of said control gate after said step A;
   wherein said tunnel dielectric structure, said floating dielectric structure, and said control gate have said first length after said step B; and
   C. forming drain and source bit line junctions of said flash memory cell;
   wherein said trim of said length of said floating gate structure minimizes overlap of said floating gate structure over at least one of said drain and source bit line junctions.

2. The method of claim 1, wherein both of said first and second sidewalls of said floating gate structure are trimmed.

3. The method of claim 1, wherein only a sidewall of said floating gate structure disposed toward said drain bit line junction is trimmed.

4. The method of claim 1, wherein only a sidewall of said floating gate structure disposed toward said source bit line junction is trimmed.

5. The method of claim 1, wherein said floating gate structure has a substantially rectangular shape after said step of trimming said length of said floating gate.

6. The method of claim 5, wherein said floating gate structure is trimmed by an isotropic etching process that etches said floating gate structure doped with a gate dopant at a faster rate than an etching rate of said control gate not doped with said gate dopant.

7. The method of claim 1, wherein said floating gate structure has a substantially tapered shape after said step of trimming said length of said floating gate.

8. The method of claim 7, wherein a sidewall portion of said floating gate structure having a drain and source dopant implanted therein at an angle is etched away such that said length of said floating gate structure tapers down to have a smaller length toward said tunnel dielectric structure.

9. The method of claim 1, wherein said floating gate structure is trimmed by an isotropic etching process that etches said floating gate structure doped with a gate dopant at a faster rate than an etching rate of said control gate not doped with said gate dopant.

10. The method of claim 1, wherein a sidewall portion of said floating gate structure having a drain and source dopant implanted therein at an angle is etched away such that said length of said floating gate structure tapers down to have a smaller length toward said tunnel dielectric structure.

11. The method of claim 1, wherein said tunnel dielectric material is comprised of nitrogen oxide ($N_2O$) and silicon dioxide ($SiO_2$).

12. A method for fabricating a flash memory cell, including the steps of:
   A. forming, on a semiconductor substrate, a stack of a tunnel dielectric structure, a floating gate structure, a floating dielectric structure, and a control gate;
   B. trimming only one sidewall of said floating gate structure disposed toward one of a drain bit line junction or a source bit line junction; and
   C. forming drain and source bit line junctions of said flash memory cell;
   wherein said trim of said one side of said floating gate structure minimizes overlap of said floating gate structure over one of said drain and source bit line junctions.

13. The method of claim 12, wherein only a sidewall of said floating gate structure disposed toward said drain bit line junction is trimmed.

14. The method of claim 12, wherein only a sidewall of said floating gate structure disposed toward said source bit line junction is trimmed.

15. The method of claim 12, wherein said floating gate structure has a substantially rectangular shape after said step of trimming said floating gate.

16. The method of claim 15, wherein said floating gate structure is trimmed by an isotropic etching process that etches said floating gate structure doped with a gate dopant at a faster rate than an etching rate of said control gate not doped with said gate dopant.

17. The method of claim 12, wherein said trimmed side of said floating gate structure has a substantially tapered shape after said step of trimming said floating gate.

18. The method of claim 17, wherein a sidewall portion of said floating gate structure having a drain and source dopant implanted therein at an angle is etched away such that said length of said floating gate structure tapers down to have a smaller length toward said tunnel dielectric structure.

19. The method of claim 12, wherein said tunnel dielectric material is comprised of nitrogen oxide ($N_2O$) and silicon dioxide ($SiO_2$).

20. A method for fabricating a flash memory cell of an electrically programmable memory device on a semiconductor substrate, the method including the steps of:
   A. depositing a layer of tunnel dielectric material on said semiconductor substrate;
   B. depositing a layer of floating gate material on said layer of tunnel dielectric material;
   C. depositing a layer of floating dielectric material on said layer of floating gate material;
   D. depositing a layer of control gate material on said floating dielectric material;
   E. patterning a layer of patterning material on said layer of control gate material to form a patterning structure having a first length on said layer of control gate material;
   F. etching away any region of said layer of tunnel dielectric material, said layer of floating gate material, said layer of floating dielectric material, and said layer of control gate material not under said patterning structure to form a tunnel dielectric structure comprised of said tunnel dielectric material disposed under said patterning structure, to form a floating gate structure comprised of said floating gate material disposed under said patterning structure, to form a floating dielectric structure comprised of said floating dielectric material disposed under said patterning structure, and to form a control gate structure comprised of said control gate material disposed under said patterning structure;
   G. trimming a length of said floating gate structure from said first length of said patterning structure to a second length at an interface between said floating gate structure and said tunnel dielectric structure by etching away a portion of said floating gate material from at least one of a first sidewall and a second sidewall of said floating gate structure;
   H. forming a drain bit line junction of said flash memory cell toward said first sidewall of said floating gate structure, and forming a source bit line junction of said flash memory cell toward said second sidewall of said floating gate structure, by implanting a drain and source dopant into exposed regions of said semiconductor substrate; and
   I. performing a thermal anneal such that said floating gate structure overlaps said drain bit line junction of said flash memory cell by being disposed over a portion of said drain bit line junction of said flash memory cell and such that said floating gate structure overlaps said source bit line junction of said flash memory cell by being disposed over a portion of said source bit line junction of said flash memory cell,
   wherein said trim of said length of said floating gate structure minimizes said overlap of said floating gate structure over at least one of said drain bit line junction of said flash memory cell and said source bit line junction of said flash memory cell to minimize leakage of charge from said floating gate structure during programming or erasing of said flash memory cell;
   and wherein said floating gate material of said floating gate structure is comprised of in-situ doped polysilicon doped with arsenic, wherein said floating dielectric material of said floating dielectric structure is comprised of silicon dioxide ($SiO_2$), wherein said control gate material of said control gate structure is comprised of undoped polysilicon, and wherein said patterning material of said patterning structure is comprised of photoresist material.

* * * * *